United States Patent
McEwen et al.

(10) Patent No.: US 6,728,894 B2
(45) Date of Patent: *Apr. 27, 2004

(54) SYSTEM AND METHOD FOR CLOCK ADJUSTMENT BY SUBSEQUENTLY DETECTING A TARGET BIT OF DATA STREAM, RE-ADJUSTING, AND CORRECTING CLOCK BASED ON DIFFERENCE IN DETECTED BIT

(75) Inventors: Peter McEwen, Santa Clara, CA (US); Ara Patapoutian, Westborough, MA (US); Ke Han, Davis, CA (US); Eduardo Veiga, Sunnyvale, CA (US); Jeffrey L. Sonntag, Portland, OR (US)

(73) Assignee: Maxtor Corporation, Longmont, CO (US)

( * ) Notice: Subject to any disclaimer, the term of this patent is extended or adjusted under 35 U.S.C. 154(b) by 458 days.

This patent is subject to a terminal disclaimer.

(21) Appl. No.: 09/785,430

(22) Filed: Feb. 16, 2001

(65) Prior Publication Data

US 2002/0116667 A1 Aug. 22, 2002

(51) Int. Cl.[7] ................................................. G06F 11/00

(52) U.S. Cl. ...................... 713/503; 713/400; 713/401; 713/500; 713/502; 713/600; 714/704; 714/709; 714/762

(58) Field of Search ................................ 713/400–401, 713/500, 501–503, 600; 714/704, 709, 762

(56) References Cited

U.S. PATENT DOCUMENTS

| | | | |
|---|---|---|---|
| 5,452,325 A | 9/1995 | Brown et al. | ................ 375/376 |
| 6,236,343 B1 | 5/2001 | Patapoutian | ................ 341/111 |
| 2002/0087910 A1 * | 7/2002 | McEwen et al. | ............ 713/503 |

* cited by examiner

*Primary Examiner*—Thomas Lee
*Assistant Examiner*—Nitin C Patel
(74) *Attorney, Agent, or Firm*—David M. Sigmond

(57) ABSTRACT

Adjusting a clock signal includes receiving a data stream, detecting a bit in the data stream using a first amount of data in the data stream, adjusting the clock signal based on the detected bit, detecting the bit in the data stream using a second amount of data in the data stream, the second amount of data comprising more data than the first amount of data, and correcting the clock signal if a result of initial detecting differs from a result of subsequent detecting.

26 Claims, 8 Drawing Sheets

SYSTEM AND METHOD FOR CLOCK ADJUSTMENT BY SUBSEQUENTLY DETECTING A TARGET BIT OF DATA STREAM, RE-ADJUSTING, AND CORRECTING CLOCK BASED ON DIFFERENCE IN DETECTED BIT

TECHNICAL FIELD

This invention relates generally to adjusting a clock signal and, more particularly, to a disk drive that adjusts a data sampling clock signal based on detected bits.

BACKGROUND

Phase-locked loops (PLLs) operate in a system, such as a disk drive, to synchronize the system and to improve signal-to-noise (SNR) ratios in the system. In a disk drive, an analog signal is read from a storage medium, such as a computer hard disk, and is sampled using an analog-to-digital (A/D) converter driven by a clock signal. If the clock signal is out of phase with the analog signal, errors may occur in the data detected from the resulting waveform.

SUMMARY

In general, in one embodiment, the invention is directed to adjusting a clock signal. This aspect features receiving a data stream, detecting a bit in the data stream using a first amount of data in the data stream, adjusting the clock signal based on the detected bit, detecting the bit in the data stream using a second amount of data in the data stream, the second amount of data comprising more data than the first amount of data, and correcting the clock signal if a result of initial detecting differs from a result of subsequent detecting. By virtue of this aspect, it is possible to making timing decisions quickly without suffering a significant reduction in decision accuracy.

This aspect may include one or more of the following features. The clock may be adjusted by providing the detected bit to a phase-locked loop and adjusting the clock signal using the phase-locked loop. Adjusting the clock may include generating a first waveform using the detected bit, generating a second waveform from the data stream, obtaining a phase difference between the first and second waveforms, and changing a phase of the clock signal to compensate for the phase difference. The phase difference may be incorporated into an averaged phase difference and the clock signal may be changed using the averaged phase difference.

The bit may be detected by determining whether the bit is a zero or a one or by determining a probability that the bit is a zero and a probability that the bit is a one. The subsequent detecting may also include determining whether the bit is a zero or a one or determining a probability that the bit is a zero and a probability that the bit is a one.

The details of one or more embodiments of the invention are set forth in the accompanying drawings and the description below. Other features and advantages of the invention will be apparent from the following description, drawings and claims.

DETAILED DESCRIPTION

Figure 1:
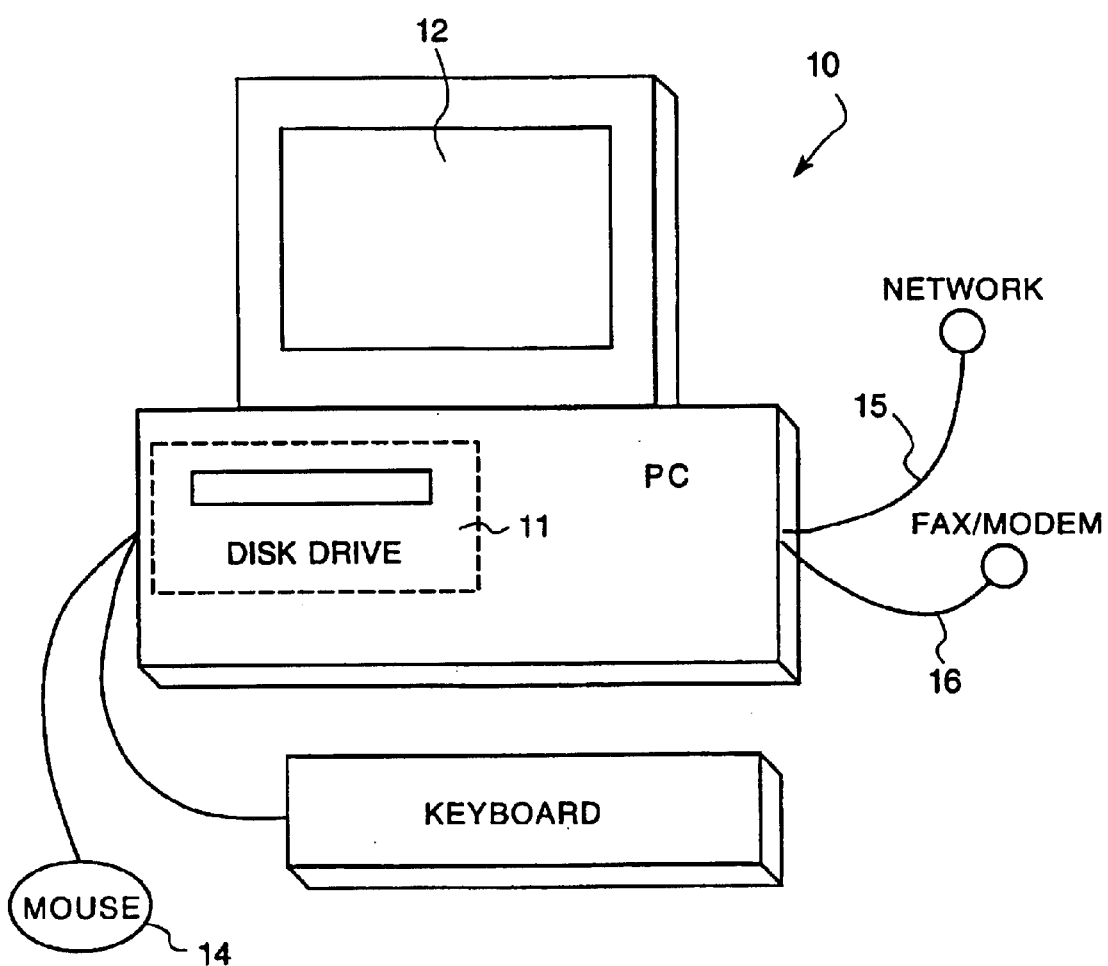
FIG. 1 is a perspective view of a personal computer that includes a disk drive.

FIG. 1 shows a personal computer (PC) 10. PC 10 includes a disk drive 11, a display screen 12, which displays information to a user, and input devices 14 which input data. Network interface 15 and fax/modem interface 16 are also provided which connect PC 10 to a network (not shown).

Figure 2:
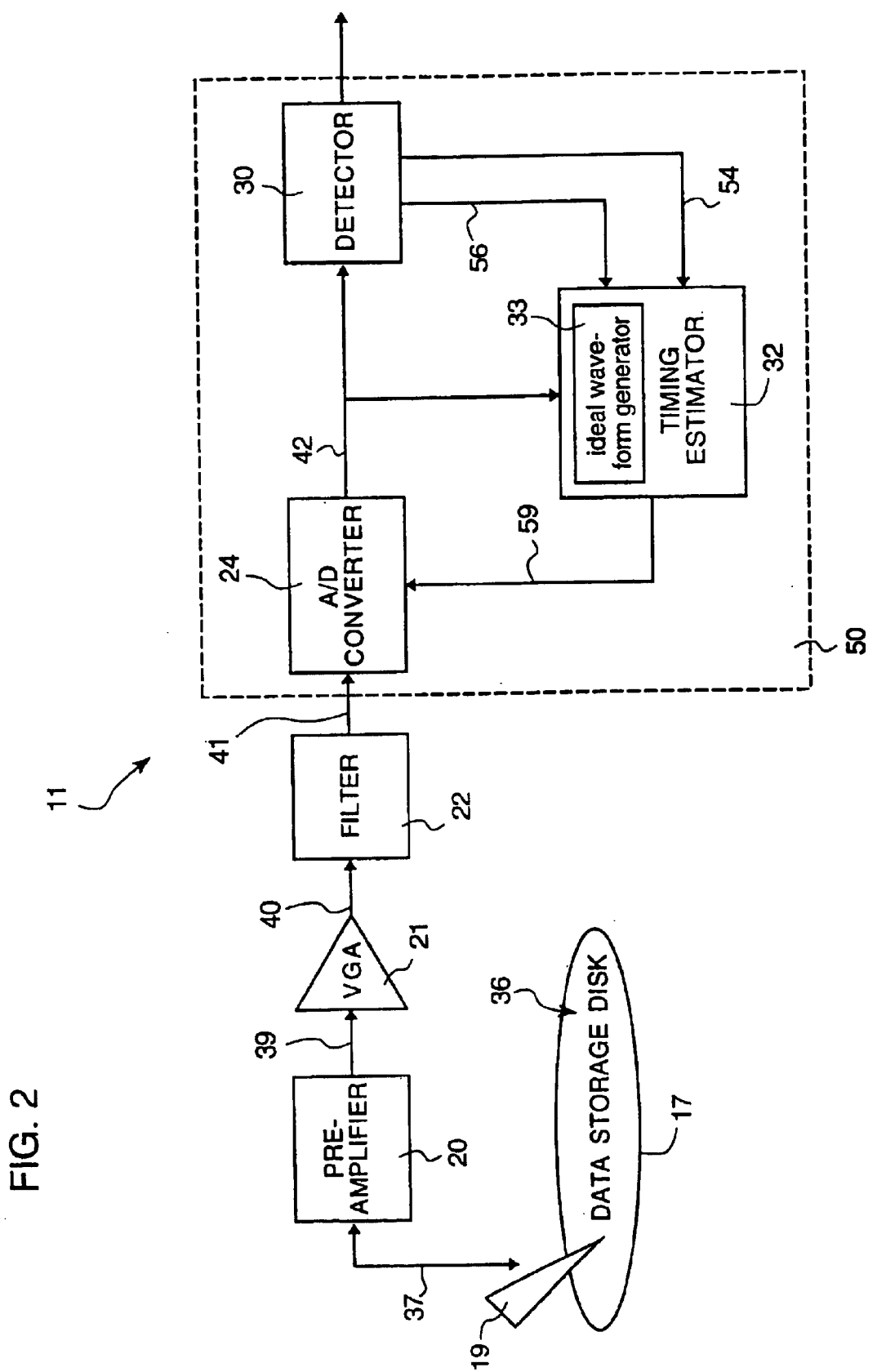
FIG. 2 is a block diagram showing representative components of the disk drive.

Referring to FIG. 2, disk drive 11 includes data storage disk 17, transducer head 19, pre-amplifier 20, analog variable gain amplifier (VGA) 21, filter 22, A/D (Analog-to-Digital) converter 24, detector 30, and timing estimator circuit 32. The foregoing circuitry of disk drive 11 may be implemented as one or more circuit elements, such as an ASIC (Application-Specific Integrated Circuit) or logic gates.

Figure 3:
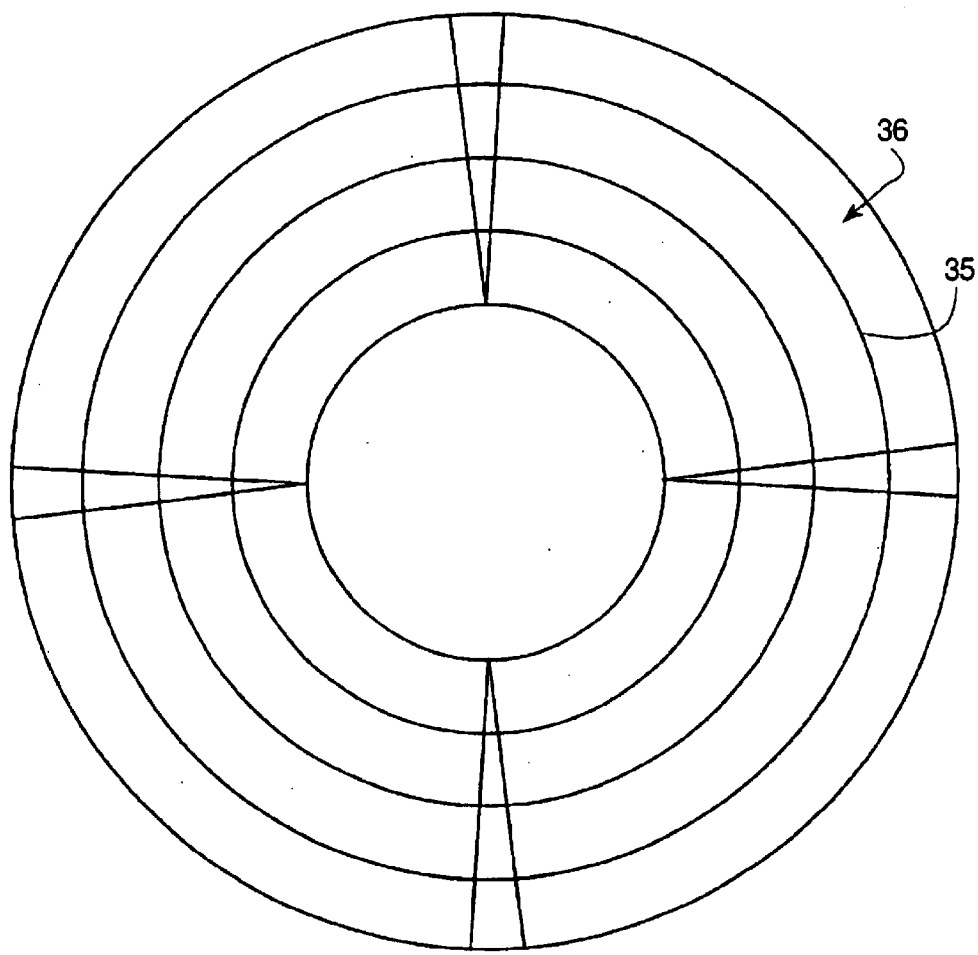
FIG. 3 is a top view of a computer storage disk in the disk drive.

Data storage disk 17 is a magnetic disk, optical disk, or any other type of storage disk having concentric data storage tracks defined on one or both of its storage surfaces. A close-up view of these tracks 35 is shown in FIG. 3. Data storage disk 17 is rotated inside disk drive 11 while data is read from/written to its tracks. Although only one data storage disk 17 is shown, more than one disk may be included in disk drive 11.

Transducer head 19 may be a giant magneto-resistive (GMR) head, or similar device, that is capable of reading data from, and writing data to, data storage disk 17. Transducer head 19 is associated in a "flying" relationship over a storage surface 36 of disk 17, meaning that it is movable relative to, and over, storage surface 36 in order to read and write data on storage surface 36.

During reading, head 19 senses flux transitions as it "flies" in close proximity to a selected channel on disk 17. These flux transitions 37 are provided to pre-amplifier 20. Pre-amplifier 20 is a voltage pre-amplifier that amplifies the flux transitions from millivolts (mV) to volts (V). Resulting pre-amplified analog signal ("read signal") 39 is provided to VGA 21. VGA 21 amplifies read signal 39 and provides a resulting amplified read signal 40 to filter 22.

Filter 22 is an analog filter that equalizes amplified read signal 40. To this end, filter 22 is programmed in accordance with the data transfer rate of a data zone on disk 17 from which signal 40 ultimately originated. Resulting filtered signal 41 is subjected to sampling (including possible over-sampling) and quantization within high-speed A/D converter 24. A/D converter 24 outputs digitized data 42 generated from signal 41.

PLL 50 is used to reduce the phase difference (or "phase error") between the synchronous digital data and a data sampling clock signal, as described below.

Detector 30 receives data 42 from A/D converter 24 and performs a detection operation on that data. In more detail, data stored on disk 17 may be coded prior to storage using an error correcting code, which means that the sampled data is also coded. Detector 30 is a Viterbi detector which decodes (i.e., removes) intersymbol interference (ISI) in the sampled data and determines the identity of bits in that data. Detector 30 determines whether a target bit is a "1" or a "0" based on data that is before and/or after data for the target bit in the bitstream. The more data that detector 30 can reference when making the determination, the more accurate the resulting bit decisions are. One or more other detectors for detecting codes, timing and/or ISI could be added to the circuitry following detector 30. There may be iteration between these one or more other detectors in order to improve detection of codes, timing and/or ISI.

When identifying the bits, detector 30 makes both "long-latency" bit decisions 54 and "fast" bit decisions 56. Accuracy is more important than speed in the longer-latency bit decisions, whereas speed is more important than accuracy in the fast bit decisions. There are two reasons for this. First, the longer-latency bit decisions may be used in generating the output of disk drive 11 and, therefore, should be as accurate as possible. Second, the fast bit decisions are used in feedback loop/PLL 50 to improve timing; hence, time delays should be reduced as much as possible. The fast bit decisions, unlike the longer-latency bit decisions, are therefore made more quickly and without common noise reduction processing. In this embodiment, the fast bit decisions are made after only a small amount of samples following data for the target bit are received, e.g., four, five or six samples. By contrast, the longer-latency bit decisions take into account data (e.g., ten bits) following the target bit, resulting in a more accurate bit determination.

Timing estimator 32, which includes a phase detector (not shown) and other circuitry, including ideal waveform generator 33, receives bit decisions 54 and/or 56 from detector 30. Timing estimator 32 determines phase errors, meaning phase differences, between the bit decisions and sampled data 42. This is done by generating an "ideal" waveform from the bit decisions and comparing that ideal waveform to an "actual" waveform generated from sampled data 42 (the "original" data). The difference between the two waveforms is the phase error. Timing estimator 32 uses this phase error to adjust (i.e., change) the phase of a clock signal 59 that is output to, and clocks, A/D converter 24.

Figure 4:
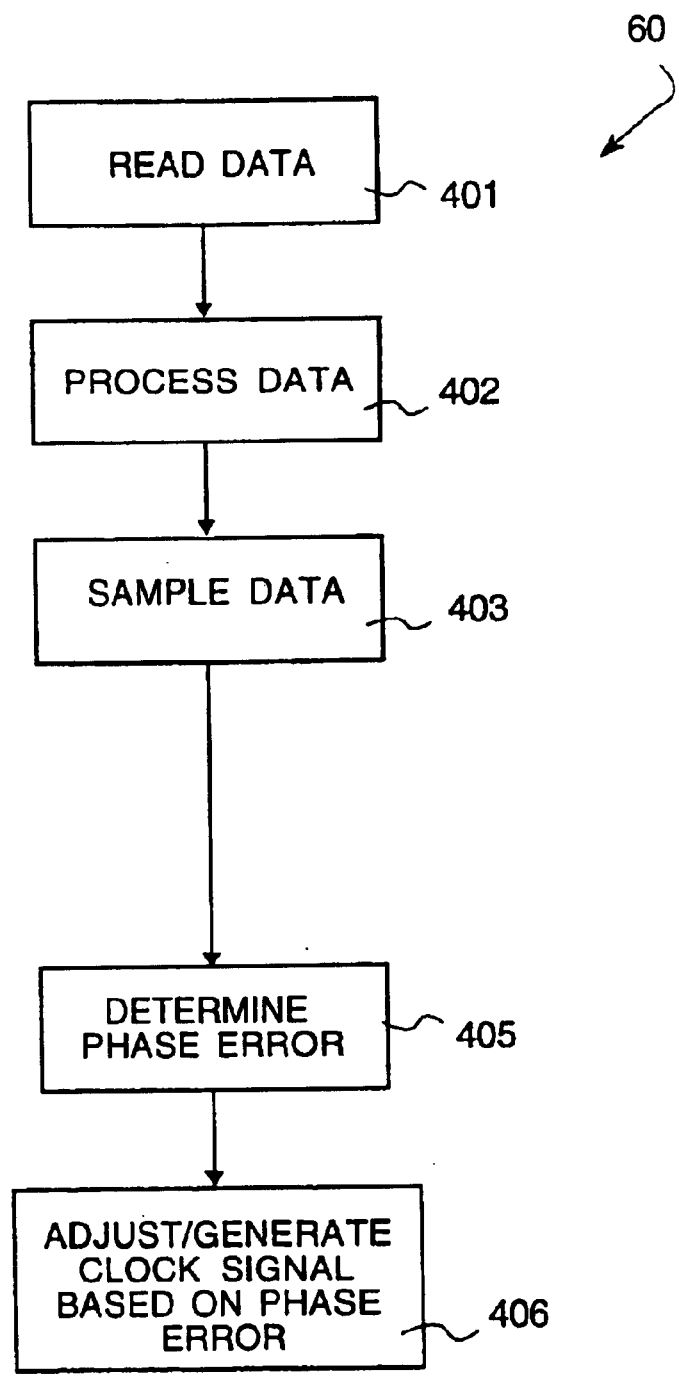
FIG. 4 is a flowchart showing a process for obtaining a phase error of the data.

Referring to FIG. 4, a process 60 is shown for obtaining the phase error of the data and for generating a clock signal which reduces phase errors in subsequently-sampled data.

Process 60 reads (401) data from storage medium 17 using transducer head 19, processes (402) the read data using pre-amplifier 20, VGA 21 and filter 22, and samples (403) the processed data using A/D converter 24. The resulting digitized signal 42 is provided from MD converter 24 to both timing estimator 32 and detector 30. Timing estimator 32 and associated circuitry determines (405) the phase error in the data signal. Once the phase error has been determined, process 60 generates and adjusts (406) clock signal 59 using the phase error. This is done by correcting the phase of the clock signal to compensate for the phase error. Examples of methods for determining the phase error in data are described in U.S. patent application Ser. No. 09/755,252, entitled "Determining The Timing Of A Data Signal" and filed on Jan. 4, 2001, the contents of which are hereby incorporated by reference into the subject application as if set forth herein in full. A mixer (not shown) driven by a crystal oscillator in timing estimator 32 may be used to produce clock signal 59. Clock signal 59 is applied to A/D converter 24 to sample the data.

Figure 5:
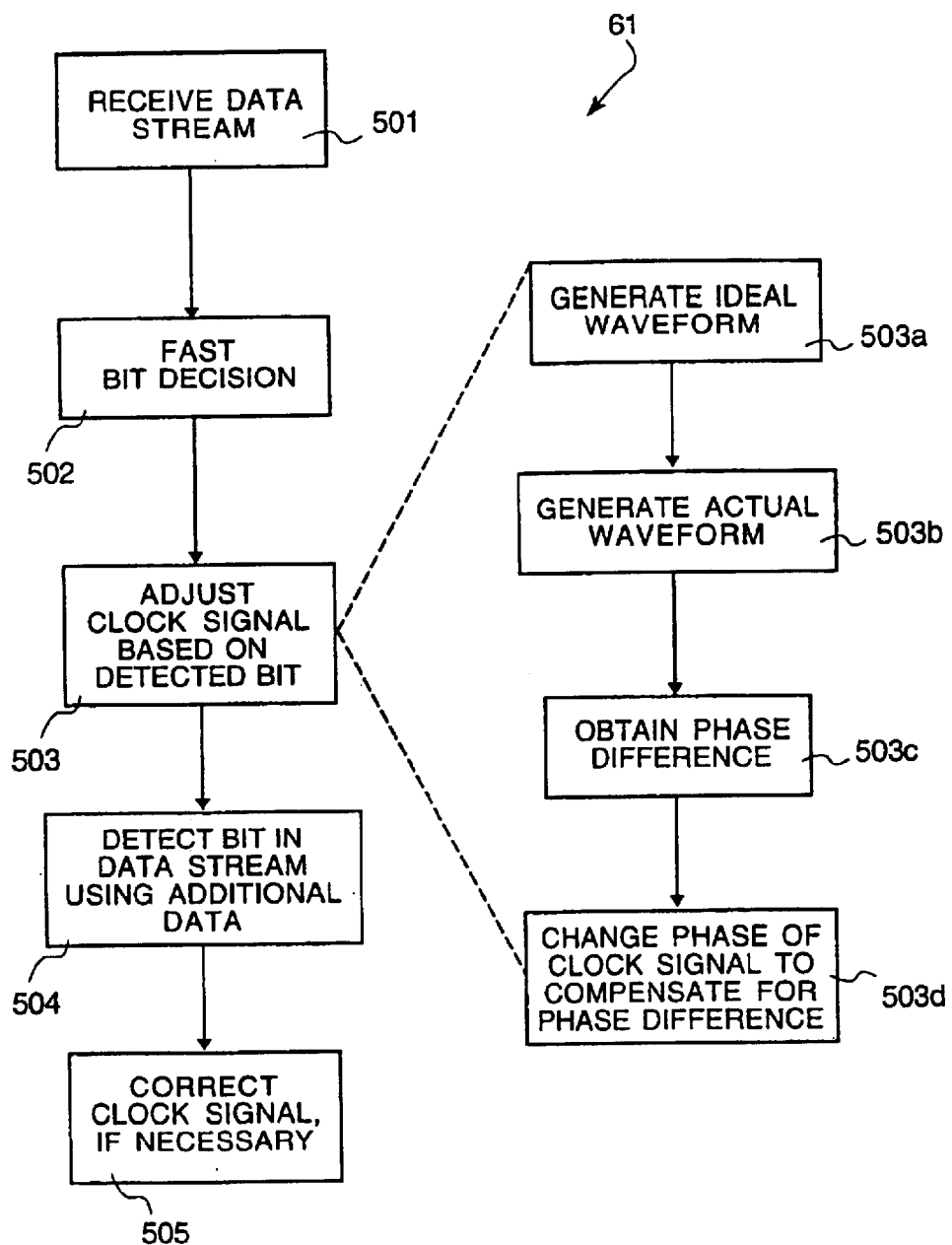
FIG. 5 is a flowchart showing a process for adjusting a clock signal to correct the phase error in data read by the disk drive.

Referring to FIG. 5, a process 61 is shown by which disk drive 11 determines the phase error and adjusts clock signal 59 to compensate for the phase error. Process 61 may be used alone or in conjunction with any of the processes described in U.S. patent application Ser. No. 09/755,252, entitled "Determining The Timing Of A Data Signal" and filed on Jan. 4, 2001.

Detector 30 makes "fast bit" decisions virtually as soon as the data stream is received (501). That is, detector 30 makes the bit decision (502) after only a small amount of samples following data for the target bit are received, e.g., four, five or six samples. In this embodiment, detector 30 determines whether the bit is a one or a zero. In this embodiment, detector 30 does this by using a decision at a given depth from a Viterbi detector.

Detector 30 provides detected bits, i.e., fast bits 56, to timing estimator 32 in feedback loop/PLL 50. Timing estimator 32 adjusts (503) clock signal 59 using the detected bits. Timing estimator 32 determines a phase error in the data using the detected bits and adjusts the phase of clock signal 59 to compensate for this phase error. Timing estimator 32 determines the phase error as follows.

Figure 6:
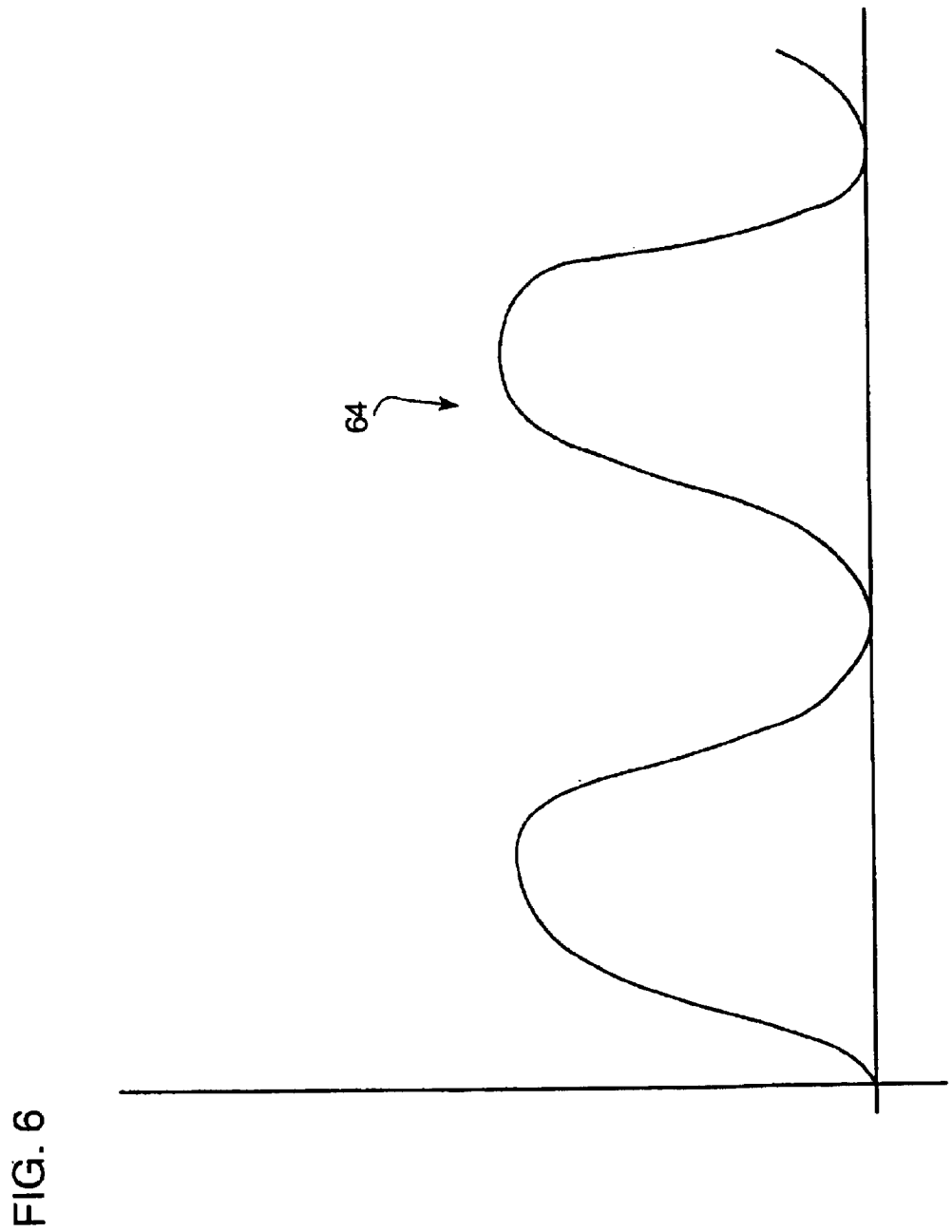
FIG. 6 shows an ideal waveform of data that is used in correcting the phase error in the process of FIG. 5.

Ideal waveform generator 33 in timing estimator 32 generates (503a) an ideal waveform from fast bits 56. This is done by reconstructing a substantially noiseless (or "ideal") waveform from the fast bits. An example of an ideal waveform 64 produced by ideal waveform generator 33 is shown in FIG. 6. Timing estimator 32 obtains the phase error in the data using this ideal waveform and an actual waveform. Timing estimator 32 generates (503b) the actual waveform using sampled data that corresponds to the fast bits detected by detector 30 and that are used to generate the ideal waveform. To obtain (503c) the phase error, timing estimator 32 determines the phase difference between the ideal and actual waveforms.

The phase error is used to adjust the clock signal. The clock signal is adjusted by changing (503d) its phase by the amount of the phase error. As noted, a mixer (not shown) driven by a crystal oscillator in timing estimator 32 may be used to maintain the clock signal. The phase of this mixer is changed to adjust the clock signal. An average phase error may be used to adjust the clock signal instead of a single-phase error, since averaging reduces the effects of noise and other extraneous effects on the phase error.

To this end, timing estimator 32 incorporates the phase error into an "averaged" phase error that has been averaged over time, e.g., over several hundred data samples. Averaging may be performed using a loop filter (not shown) in timing estimator 32. In this embodiment, the loop filter is a proportional integral (PI) filter that contains a proportional term and an integral term followed by an integrator term. The proportional term multiplies the filter input by a first coefficient ($\alpha$) and the integral term uses a second coefficient ($\beta$) to integrate the inputs to the loop filter, namely the phase errors, over time to generate and averaged phase error. The averaged phase error may then be used to adjust the clock signal.

Since the fast bit decisions are made without taking into account much data that follows the bit in the data stream, the fast bit decisions may contain errors. As noted above, the longer-latency bit decisions take into account larger amounts of data that follows the bit in the data stream than the fast bit decisions; therefore, the longer-latency bit decisions are generally more accurate than the fast bit decisions. Accordingly, process 61 uses the longer-latency bit decisions to correct phase errors that may have been introduced as a result of the fast bit decisions.

To this end, detector 30 makes the longer-latency bit decisions by detecting (504) bits in the data stream using additional data that follows the bit in the data stream. For example, detector 30 may wait the equivalent of ten, twenty, or fifty bits of data before making a decision on a target bit. The additional data allows detector to compare a target bit to other bits, thus increasing the accuracy of the target bit detection. This is illustrated in FIG. 7.

Figure 7:
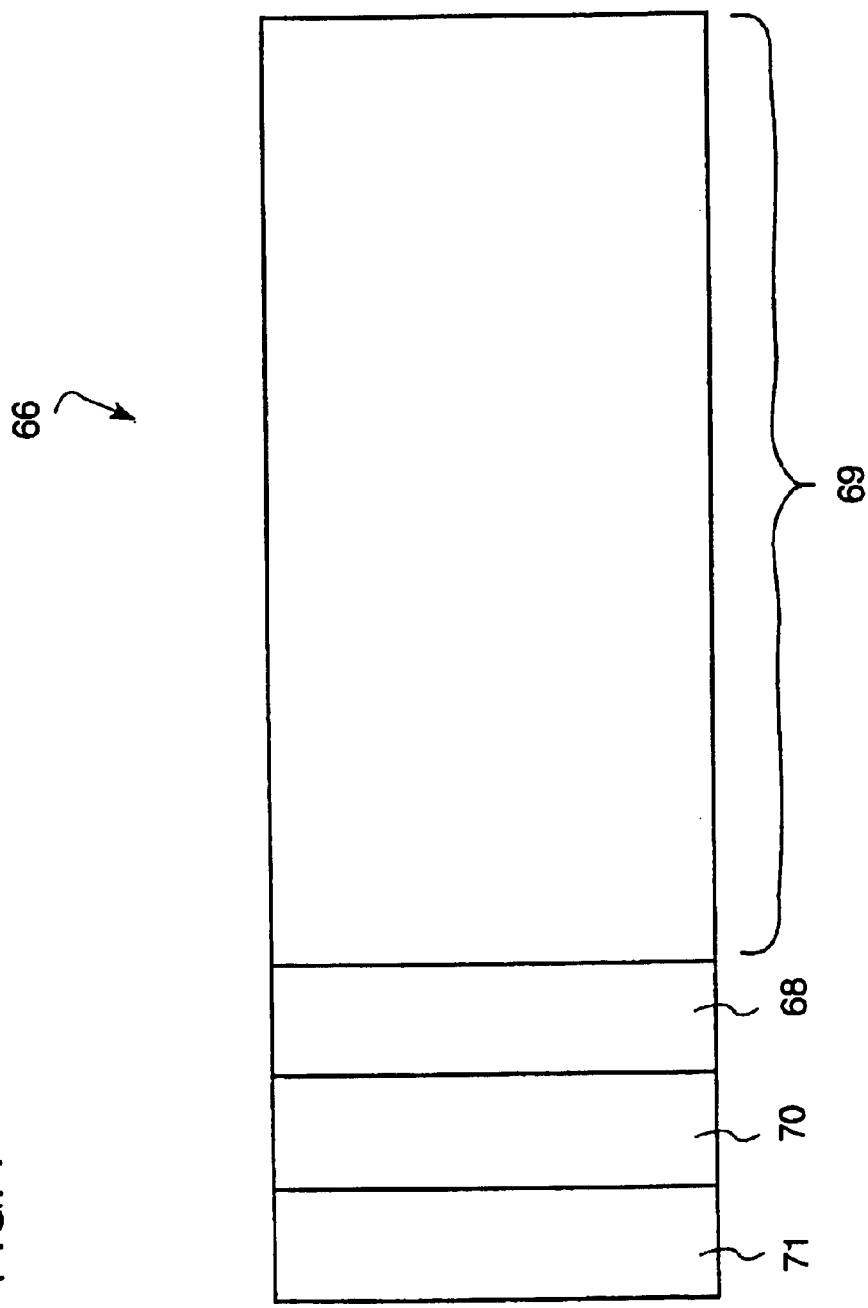
FIG. 7 is a view of a data stream.

Referring to FIG. 7, detector 30 receives data stream 66 and detects target bit 68. If this were a fast bit decision, detector 30 would detect bit 68 following, e.g., four, five or six samples. However, since this is a longer-latency bit decision, detector 30 waits for additional data 69 to be received before making a decision on (i.e., detecting) bit 68. Detector 30 waits for a similar amount of data to pass before detecting subsequent bits 70 and 71, and so on for the remaining bits in data stream 66.

Timing estimator 32 may store the longer-latency bit decisions, at least temporarily, in a memory (not shown). When timing estimator 32 receives the longer-latency bit decisions, timing estimator 32 compares the longer-latency bit decisions to corresponding stored bit fast bit decisions. If the longer-latency bit decisions match the corresponding fast bit decisions, timing estimator 32 takes no action, since the fast bit decisions were correct. If, however, a longer-latency bit decision does not match a corresponding stored fast bit decision, timing estimator 32 corrects (505) clock signal 59 based on the longer-latency bit decision. That is, timing estimator 32 substitutes the longer-latency bit decision for the fast bit decision and determines the phase error according to 503a to 503d using the longer-latency bit decision. If the phase error is part of an averaged phase error, timing estimator 32 substitutes this new phase error for the old phase error in the averaged phase error. Timing estimator 32 corrects the clock signal using the new phase error in the manner described above.

Rather than waiting for a large amount of data, e.g., twenty bits, before making longer-latency bit decisions, process 61 may continuously update its fast bit decisions. That is, detector 30 may make a fast bit decision for a target bit and, each time data for a new bit is received, make a new bit decision for the target bit taking into account the newly-received data. The bit decisions and correction of previous bit decisions is performed in the same manner as above.

In the foregoing embodiment, detector 30 determines whether a bit is a one or a zero. In an alternative embodiment, detector 30 uses so-called "soft data". In this context, soft data is data that defines the probability that a target bit is a zero and a probability that the target bit is a one. For example, detector 30 may generate one eight-bit word for each bit. The word indicates the probability that a bit is a zero or a one. Soft data for both fast bit decisions and longer-latency bit decisions is provided to timing estimator 32 as above.

Timing estimator 32 operates in the same manner as above. That is, ideal waveform generator 33 in timing estimator 32 generates (503a) an ideal waveform from the "fast bit" soft data. This is done by reconstructing an ideal waveform from the soft data. The ideal waveform, in this case, is generated, using the "soft" data.

As above, timing estimator 32 generates (503b) the actual waveform using sampled data (from asynchronous samples buffer) that corresponds to the bits detected by detector 30 and that are used to generate the ideal waveform. To obtain (503c) the phase error, timing estimator 32 determines the difference between the ideal waveform and the actual waveform. The remainder of the process is the same as above, except that soft data is also used for correcting (505) the clock signal using the longer-latency bit decisions.

Figure 8:
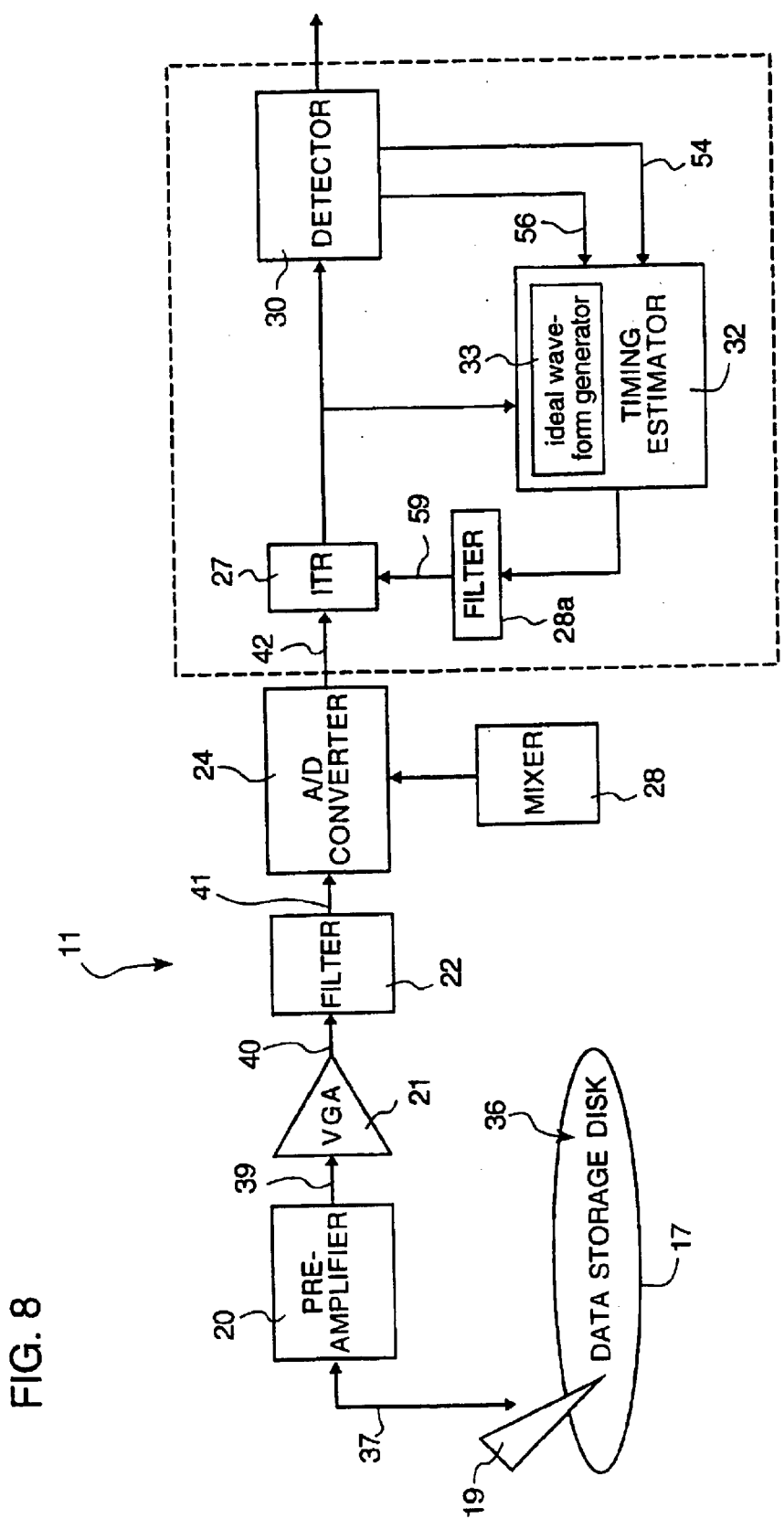
FIG. 8 is a block diagram showing representative components of an alternative embodiment of the disk drive.

In the alternative embodiment of disk drive 11 shown in FIG. 8, interpolated timing recovery circuit (ITR) 27 samples data 42 from A/D converter 24. ITR 27 samples the data using a clock signal that is generated by timing estimator 32 (described above). In this embodiment, a mixer 28 with a crystal phase oscillator generates the clock to the A/D converter and filter 28a, which may be a PI filter as described above, provides clock 59 to ITR 27. The phase of the clock to ITR 27 is controlled in accordance with processes 60 and 61 described above.

Hardware implementations are shown for processes 60 and 61. Processes 60 and 61, however, are not limited to use with any particular hardware or software configuration; they may find applicability in any computing or processing environment. All or part of processes 60 and 61 may be implemented in hardware, software, or a combination of the two. All or part of processes 60 and 61 may be implemented in one or more computer programs executing on programmable computers or other types of machines that each include a processor, a storage medium readable by the processor (including volatile and non-volatile memory and/or storage elements), at least one input device, and one or more output devices. Program code may be applied to data entered using an input device to perform processes 60 and 61 and to generate output information. The output information may be applied to one or more output devices.

Each such program may be implemented in a high level procedural or object-oriented programming language to communicate with a computer system. However, the programs can be implemented in assembly or machine language. The language may be a compiled or an interpreted language.

Each computer program may be stored on a storage medium or device (e.g., CD-ROM, hard disk, or magnetic diskette) that is readable by a general or special purpose programmable computer for configuring and operating the computer when the storage medium or device is read by the computer to perform processes 60 and 61. All or part of processes 60 and 61 may be implemented as a computer-readable storage medium, configured with a computer program, where, upon execution, instructions in the computer program cause a computer to perform processes 60 and 61.

Thus, by way of example, an application-specific integrated circuit (ASIC) may be designed to perform the functions of PLL 50. Using an ASIC reduces the amount of hardware that must be included in disk drive 11. Processes 60 and 61 are also not limited to the disk drive system shown in FIG. 2. In fact, they can be used in any PLL that is used to correct phase errors in any feedback system. Fast bits decisions are not limited to four, five or six samples and longer-latency bit decisions are not limited to ten, twenty or fifty bit samples. Generally speaking, the longer-latency bit decisions are any bit decisions that take into account more data (i.e., samples) than the fast bit decisions either before or after data for a target bit in a bitstream.

Other embodiments not described herein are also within the scope of the following claims.

What is claimed is:

1. A method of adjusting a clock signal, comprising:
   receiving a data stream;
   detecting a bit in the data stream using a first amount of data in the data stream;
   adjusting the clock signal based on the detected bit;
   detecting the bit in the data stream using a second amount of data in the data stream, the second amount of data comprising more data than the first amount of data; and
   correcting the clock signal if a result of initial detecting differs from a result of subsequent detecting.

2. The method of claim 1, wherein adjusting comprises:
   providing the detected bit to a phase-locked loop; and
   adjusting the clock signal using the phase-locked loop.

3. The method of claim 1, wherein adjusting comprises:
   generating a first waveform using the detected bit;
   generating a second waveform from the data stream;
   obtaining a phase difference between the first and second waveforms; and
   changing a phase of the clock signal to compensate for the phase difference.

4. The method of claim 3, wherein:

adjusting further comprises incorporating the phase difference into an averaged phase difference; and the phase of the clock signal is changed using the averaged phase difference.

5. The method of claim 1, wherein detecting comprises determining whether a bit is a zero or a one.

6. The method of claim 1, wherein detecting comprises determining a probability that a bit is a zero and a probability that the bit is a one.

7. The method of claim 6, wherein a subsequent detecting comprises determining whether the bit is a zero or a one.

8. The method of claim 6, wherein the subsequent detecting comprises determining a probability that the bit is a zero and a probability that the bit is a one.

9. The method of claim 1, further comprising:

detecting the bit in the data using a third amount of data in the data stream, the third amount of data comprising more data than the second amount of data; and correcting the clock signal if a result of detecting using the second amount of data is different from a result of detecting using the third amount of data.

10. An apparatus for adjusting a clock signal, comprising:

a detector that receives a data stream, initially detects a bit in the data stream using a first amount of data in the data stream, and subsequently detects the bit in the data stream using a second amount of data in the data stream, the second amount of data comprising more data than the first amount of data; and a timing estimator circuit that adjusts the clock signal based on the initially-detected bit, and corrects the clock signal if a result of initial detecting differs from a result of subsequent detecting.

11. The apparatus of claim 10, wherein the timing estimator circuit is part of a phase-locked loop that adjusts the clock signal in response to the detector detecting bits in the data stream.

12. The apparatus of claim 10, wherein the timing estimator circuit adjusts the clock signal by:

generating a first waveform using the initially-detected bit;

generating a second waveform from the data stream;

obtaining a phase difference between the first and second waveforms; and changing a phase of the clock signal to compensate for the phase difference.

13. The apparatus of claim 12, wherein the timing estimator circuit adjusts the clock signal by:

incorporating the phase difference into an averaged phase difference; and changing the phase of the clock signal using the averaged phase difference.

14. The apparatus of claim 10, wherein the detector determines whether the initially-detected bit a zero or a one.

15. The apparatus of claim 10, wherein the detector determines a probability that the initially-detected bit is a zero and a probability that the initially-detected bit is a one.

16. The apparatus of claim 15, wherein the detector determines a probability that the subsequently-detected bit is a zero and a probability that the subsequently-detected bit is a one using the additional data that follows the bit.

17. The apparatus of claim 10, wherein the detector determines whether the subsequently-detected bit is a zero or a one using the additional data that follows the bit.

18. A machine-readable medium that stores executable instructions for adjusting a clock signal, the instructions causing a machine to:

receive a data stream;

detect a bit in the data stream using a first amount of data in the data stream;

adjust the clock signal based on the detected bit;

detect the bit in the data stream using a second amount of data in the data stream, the second amount of data comprising more data than the first amount of data; and correct the clock signal if a result of initial detecting differs from a result of subsequent detecting.

19. The machine-readable medium of claim 18, wherein adjusting comprises:

providing the detected bit to a phase-locked loop; and adjusting the clock signal using the phase-locked loop.

20. The machine-readable medium of claim 19, wherein:

adjusting further comprises incorporating the phase difference into an averaged phase difference over time; and the phase of the clock signal is changed using the averaged phase difference.

21. The machine-readable medium of claim 18, wherein adjusting comprises:

generating a first waveform using the detected bit;

generating a second waveform from the data stream;

obtaining a phase difference between the first and second waveforms; and changing a phase of the clock signal to compensate for the phase difference.

22. The machine-readable medium of claim 18, wherein detecting comprises determining whether a bit is a zero or a one.

23. The machine-readable medium of claim 18, wherein detecting comprises determining a probability that a bit is a zero and a probability that the bit is a one.

24. The machine-readable medium of claim 18, wherein subsequent detecting comprises determining whether the bit is a zero or a one.

25. The machine-readable medium of claim 18, wherein subsequent detecting comprises determining a probability that the bit is a zero and a probability that the bit is a one.

26. An apparatus for adjusting a clock signal, comprising:

means for receiving a data stream;

means for detecting a bit in the data stream using a first amount of data in the data stream;

means for adjusting the clock signal based on the detected bit;

means for detecting the bit in the data stream using a second amount of data in the data stream, the second amount of data comprising more data than the first amount of data; and means for correcting the clock signal if a result of initial detecting differs from a result of subsequent detecting.

* * * * *